United States Patent
Taguchi et al.

(10) Patent No.: US 11,210,030 B2
(45) Date of Patent: Dec. 28, 2021

(54) DATA STORAGE CONTROL DEVICE AND DATA STORAGE CONTROL SYSTEM

(71) Applicant: DENSO CORPORATION, Kariya (JP)

(72) Inventors: Akiyo Taguchi, Kariya (JP); Masao Kimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/903,179

(22) Filed: Jun. 16, 2020

(65) Prior Publication Data

US 2020/0401351 A1   Dec. 24, 2020

(30) Foreign Application Priority Data

Jun. 18, 2019 (JP) .............................. JP2019-112427

(51) Int. Cl.
| | |
|---|---|
| *G06F 3/06* | (2006.01) |
| *G11C 16/10* | (2006.01) |
| *B60L 50/61* | (2019.01) |
| *B60R 11/04* | (2006.01) |
| *B60R 16/023* | (2006.01) |
| *H02J 7/14* | (2006.01) |
| *G01S 13/86* | (2006.01) |
| *G01S 13/931* | (2020.01) |

(52) U.S. Cl.
CPC ............ *G06F 3/0659* (2013.01); *B60L 50/61* (2019.02); *B60R 11/04* (2013.01); *B60R 16/0231* (2013.01); *G06F 3/0604* (2013.01); *G06F 3/064* (2013.01); *G06F 3/0652* (2013.01); *G06F 3/0679* (2013.01); *G11C 16/10* (2013.01); *H02J 7/14* (2013.01); *G01S 13/865* (2013.01); *G01S 13/867* (2013.01); *G01S 13/931* (2013.01)

(58) Field of Classification Search
CPC ...... G06F 3/0659; G06F 3/0604; G06F 3/064; G06F 3/0679; G06F 3/0652; G11C 16/10; G11C 5/141
See application file for complete search history.

(56) References Cited

U.S. PATENT DOCUMENTS

2019/0333548 A1 * 10/2019 McGlaughlin ........... G11C 5/14

FOREIGN PATENT DOCUMENTS

| JP | 2014-178825 A | 9/2014 |
|---|---|---|
| JP | 2005-327210 A | 11/2015 |

\* cited by examiner

*Primary Examiner* — Masud K Khan
*Assistant Examiner* — Dustin B. Fulford
(74) *Attorney, Agent, or Firm* — Maschoff Brennan

(57) ABSTRACT

In a data storage control device for writing data into a first memory that is non-volatile memory, an information receipt unit receives voltage-related information from a power source control device. A condition determination unit determines whether a voltage condition is satisfied. When the condition determination unit determines that the voltage condition is satisfied during execution of a writing process, a memory controller determines whether a predetermined storage condition is satisfied. When the storage condition is not satisfied, the memory controller executes a first response process of withdrawing writing residual data into the first memory but setting a validity flag as invalid. When the storage condition is satisfied, the memory controller executes a second response process of writing the residual data into the first memory.

13 Claims, 10 Drawing Sheets

SECOND EMBODIMENT

SIXTH EMBODIMENT

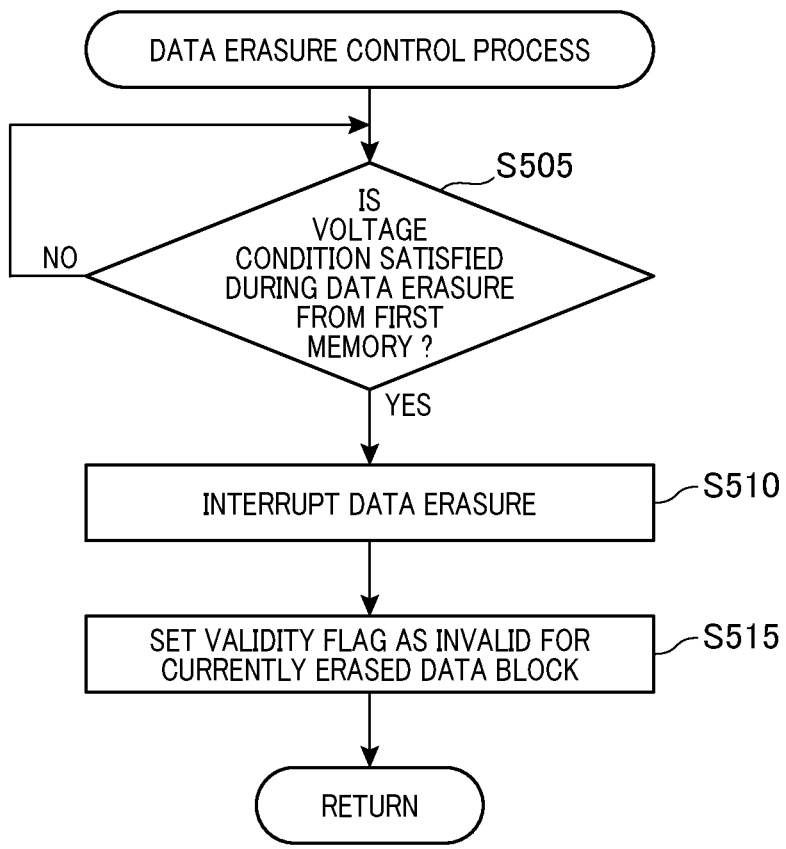

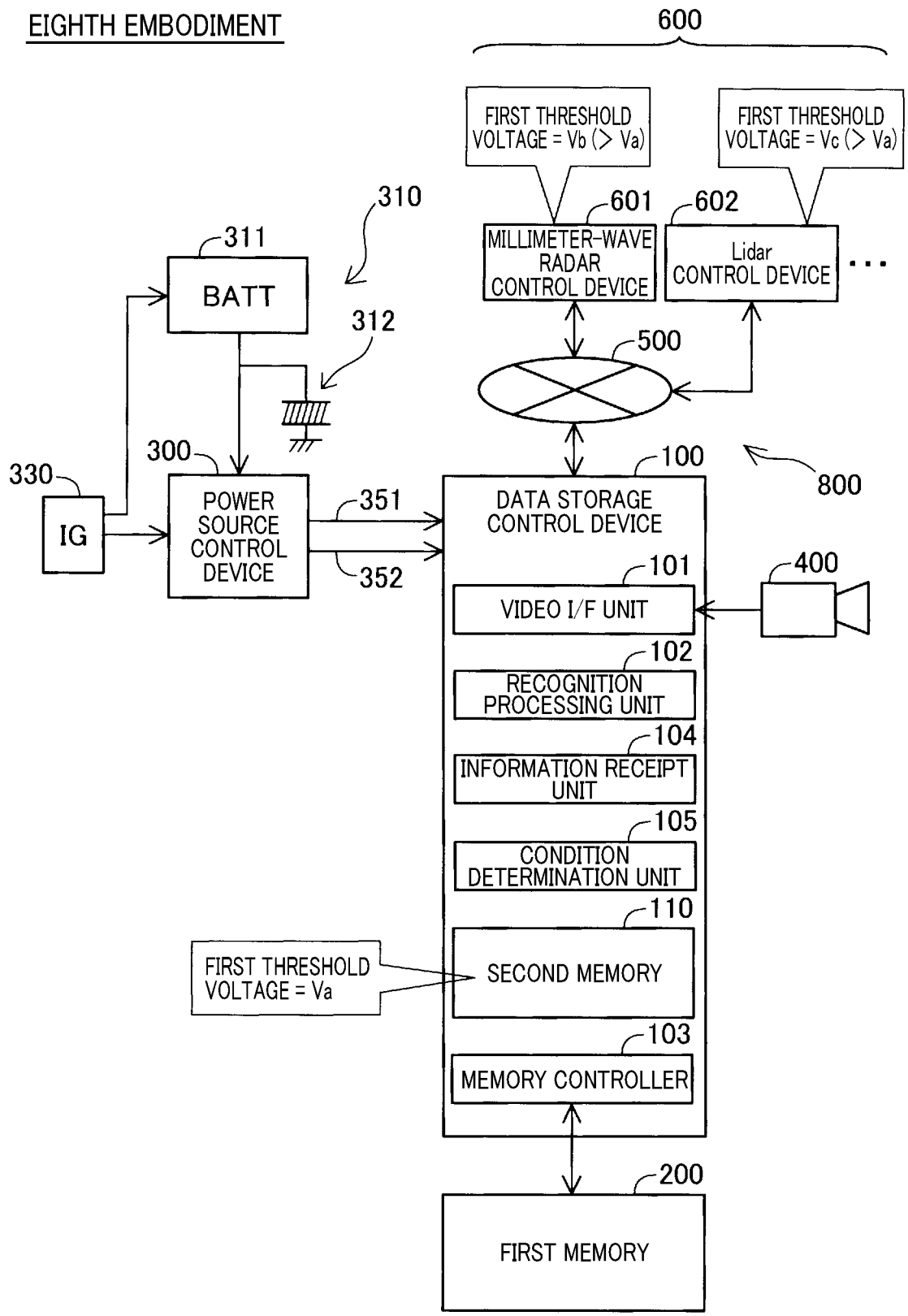

DATA STORAGE CONTROL DEVICE AND DATA STORAGE CONTROL SYSTEM

CROSS-REFERENCE TO RELATED APPLICATION

This application is based on and claims the benefit of priority from earlier Japanese Patent Application No. 2019-112427 filed Jun. 18, 2019, the description of which is incorporated herein by reference.

BACKGROUND

Technical Field

The present disclosure relates to data storage control in a non-volatile memory.

Related Art

An electronic control unit (ECU) mounted in a vehicle may store data having undergone a predetermined process by the ECU in a non-volatile memory. For example, the ECU temporarily stores image data obtained by an image-capturing camera mounted in the vehicle and detection result data obtained by millimeter-wave radar and light detection and ranging (Lidar) in a random access memory (RAM) built therein. The ECU may read the information from the built-in RAM and store the same in a flash memory when a predetermined condition such as the occurrence of a collision is satisfied.

BRIEF DESCRIPTION OF THE DRAWINGS

In the accompanying drawings:

FIG. 12 is a flowchart showing a procedure for a data erasure control process in a seventh embodiment; and FIG. 13 is a block diagram showing a schematic configuration of a data storage control system in an eighth embodiment.

DESCRIPTION OF SPECIFIC EMBODIMENTS

Figure 1:
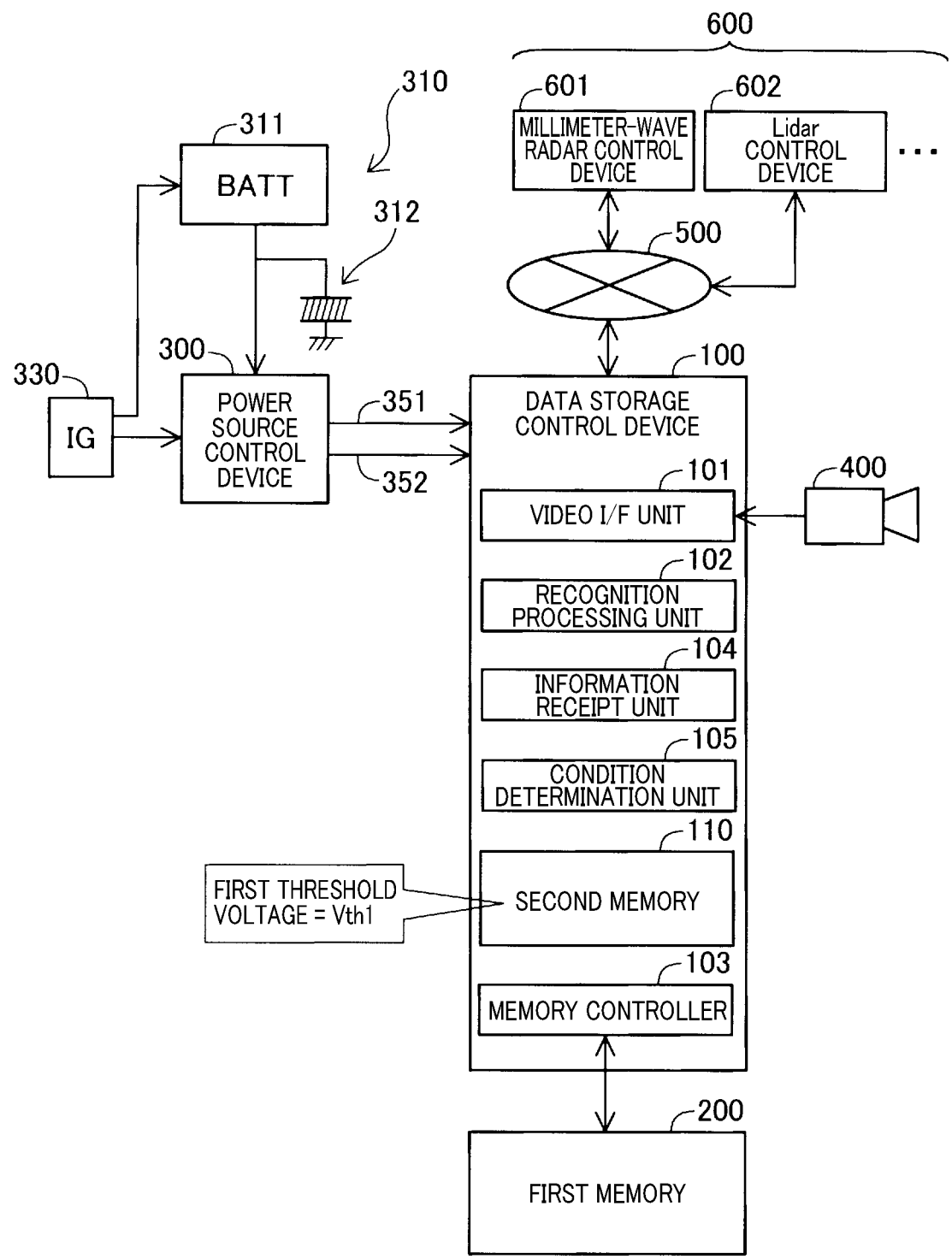
FIG. 1 is a block diagram illustrating a schematic configuration of a data storage control device as an embodiment of the present disclosure.

JP-A-2005-327210 discloses a technique for determining whether a data writing completion estimated time is longer than an available power supply duration if the voltage in a battery becomes lower than a predetermined voltage during writing of data into a non-volatile memory, and interrupting the data writing if the data writing completion estimated time is longer.

If the battery voltage returns to be equal to or higher than the predetermined voltage after the interruption of the data writing and the system including the non-volatile memory and the CPU restarts, it is preferred to perform a normality check on all data by the use of checksums such as a cyclic redundancy check (CRC) and parity check before reading the data from the non-volatile memory in order to ensure the reliability of the data. However, performing a normality check on all data will cause an issue that the system including the non-volatile memory and the CPU takes longer time to start.

This issue is found in not only writing data into the non-volatile memory but also erasing data from the non-volatile memory. For example, when part of data is erased from a certain data block, the data block from which the partial data is erased is entirely subjected to an overwriting process. Therefore, the same issue as described above may occur if the writing process is interrupted. The same issue may also occur not only when the ECU mounted in a vehicle writes data into the non-volatile memory but also when an arbitrary type of battery-driven data storage control device writes data into the non-volatile memory. Further, the same issue may occur with a decrease in not only the voltage of a battery but also the voltage of a power supply device with a combination of a battery and a capacitor.

In view of the foregoing, it is desired to have a technique for reducing the start time of a system including a non-volatile memory if data writing into the non-volatile memory is interrupted due to a decrease in the output voltage of a power supply device and then the output voltage recovers afterwards.

One aspect of the present disclosure provides a data storage control device for writing data into a first memory that is a non-volatile memory. The data storage control device includes: a second memory that is different from the first memory. In the data storage control device, a memory controller is configured to execute a writing process of writing the data from the second memory into the first memory on a block-by-block basis with a predetermined data size. An information receipt unit is configured to receive voltage-related information that relates to an output voltage of a power supply device from a power source control device that supplies an operating voltage to the data storage control device by use of the output voltage of the power supply device. A condition determination unit is configured to, using the received voltage-related information, determine whether a predetermined voltage condition is satisfied, the voltage condition being that the output voltage is estimated to become lower than a lower limit-corresponding voltage corresponding to a lower limit voltage in a predetermined voltage range that is predetermined as a normal voltage range of the operating voltage. In the data storage control device, the data block stored in the first memory includes data stored in the second memory and a validity flag that indicates validity of the data. The memory controller is configured to: in response to the condition determination unit determining that the voltage condition is satisfied during execution of the writing process, determine whether a predetermined storage condition is satisfied, the storage condition being that residual data yet to be written in a currently written block that is currently being written is estimated to be writable into the first memory by the time when the output voltage becomes lower than the lower limit-corresponding voltage; in response to determining that the storage condition is not satisfied, execute a first response process of withdrawing writing the residual data into the first memory but setting the validity flag corresponding to the currently written block as invalid; and in response to determining that the storage condition is satisfied, execute a second response process of writing the residual data yet to be written from the currently written block into the first memory.

According to the data storage control device in the aspect described above, when it is determined that the voltage condition is satisfied during execution of the writing process, it is then determined whether the storage condition is satisfied. When it is not determined that the storage condition is satisfied, the first response process is executed not to write the residual data into the first memory but set the validity flag corresponding to the currently written block as invalid. This makes it possible to suppress some corrupted data from being written into the first memory even when the output voltage of the battery becomes lower than the lower limit voltage in the predetermined voltage range before completion of the writing of the residual data. Afterwards, when the voltage of the battery recovers, the data block can be easily detected by the validity flag without having to perform a normality check on the data block, thereby shortening the start time of the system including the non-volatile memory. In addition, when it is determined that the storage condition is satisfied, the second response process is executed to write the residual data yet to be written from the currently written block into the first memory, so that the residual data can be normally written into the first memory. Therefore, in this case as well, when the voltage of the battery recovers, there is no need to perform a normality check on the data block, thereby shortening the start time of the system including the non-volatile memory. As described above, according to the data storage control device in the aspect described above, it is possible to shorten the start time of the system including the non-volatile memory if data writing into the non-volatile memory is interrupted due to a decrease in the output voltage of the power supply device and then the output voltage recovers afterwards.

The present disclosure can be implemented in various aspects other than the data storage control device. For example, the present disclosure can be implemented in the aspects of a data storage control system including a plurality of data storage control devices, a data erasure control device, a data erasure control system including a plurality of data erasure control devices, a data storage control method, a data erasure control method, a computer program for implementing these devices, systems, and methods, a storage medium storing such a computer program, and others.

Hereinafter, exemplary embodiments of the present disclosure will be described in detail with reference to the accompanying drawings, in which like reference numerals refer to like or similar elements regardless of reference numerals and duplicated description thereof will be omitted.

A. First Embodiment

A1. Device Configuration

A data storage control device 100 of a first embodiment shown in FIG. 1 contains a second memory 110 and temporarily stores captured image data obtained by an image-capturing camera 400 in the second memory 110. When a predetermined condition is satisfied, the data storage control device 100 reads the data from the second memory 110 and writes and stores the same into a first memory 200 that is formed separately from the data storage control device 100. In the present embodiment, the data storage control device 100, the image-capturing camera 400, and the first memory 200 are mounted in a vehicle. The above-mentioned "predetermined condition" refers to a condition that "the vehicle has had a collision" in the present embodiment. The image-capturing camera 400 performs image capturing at a predetermined rate. The data storage control device 100 sequentially stores frame images obtained by the image capturing into the second memory 110. In the event of a collision, the frame images stored in the second memory 110 at that time are written and stored in the first memory 200.

The first memory 200 is formed of a non-volatile memory. Specifically, in the present embodiment, the first memory 200 is formed of a flash memory. However, the first memory 200 is not limited to a flash memory but may be formed of an arbitrary type of non-volatile memory.

The data storage control device 100 is powered by a power supply device 310 mounted in the vehicle via a power source control device 300. The power supply device 310 includes a battery 311. The battery 311 outputs direct-current power of 12 V. With an input of 12 V power, the power source control device 300 lowers the power to an operating voltage of the data storage control device 100, for example, 3.3 V, and supplies the power to the data storage control device 100 via a power line 351. The power source control device 300 is formed of an integrated circuit (IC) including a power semiconductor. The power source control device 300 lowers the output voltage of the power supply device 310 and monitors the output voltage, and, as described later, notifies the value of the output voltage to the data storage control device 100 via a signal line 352.

The power supply device 310 includes a capacitor 312 in addition to the battery 311. The capacitor 312 can store the output power of the battery 311. When the voltage of the battery 311 decreases, the capacitor 312 supplies power to the data storage control device 100 via the power source control device 300, instead of the battery 311. The power source control device 300 and the battery 311 are connected to an ignition key 330. When the ignition key 330 is turned off, the power supply from the battery 311 is stopped and the capacitor 312 supplies power to the data storage control device 100 for a predetermined period of time.

In addition to the second memory 110, the data storage control device 100 includes a video interface unit 101, a recognition processing unit 102, a memory controller 103, an information receipt unit 104, and a condition determination unit 105. In the present embodiment, the data storage control device 100 is formed of a microprocessor. The recognition processing unit 102, the memory controller 103, the information receipt unit 104, and the condition determination unit 105 are functional units that are implemented by the microprocessor executing control programs stored in a read only memory (ROM) not shown.

The second memory 110 is an integral random access memory (RAM) and has storage capacity for storing only a predetermined number of frame images obtained by the image-capturing camera 400. If a number of frame images exceeding the predetermined number is input from the image-capturing camera 400, the frame image data is overwritten in chronological order according to First In, First Out (FIFO).

The video interface unit 101 has an interface for electrical connection to the image-capturing camera 400. The recognition processing unit 102 executes a process of recognizing an object (hereinafter, also called simply "recognition process"). The recognition processing unit 102 recognizes the sizes, types, and velocities of objects existing around the vehicle, by use of the captured images acquired by the image-capturing camera 400 and results of detection by millimeter-wave radar and light detection and ranging (Lidar) mounted in the vehicle. The data storage control device 100 and a control device group 600 are connected to a controller area network (CAN) 500 in the vehicle. The control device group 600 includes a millimeter-wave radar control device 601 and a Lidar control device 602. The millimeter-wave radar control device 601 controls millimeter-wave radar and transmits results of detection by the millimeter-wave radar to the data storage control device 100 via the CAN 500. The Lidar control device 602 controls Lidar and transmits results of detection by the Lidar to the data storage control device 100 via the CAN 500. In the present embodiment, the millimeter-wave radar control device 601 and the Lidar control device 602 are formed of separately independent electronic control units (ECUs).

Figure 2:
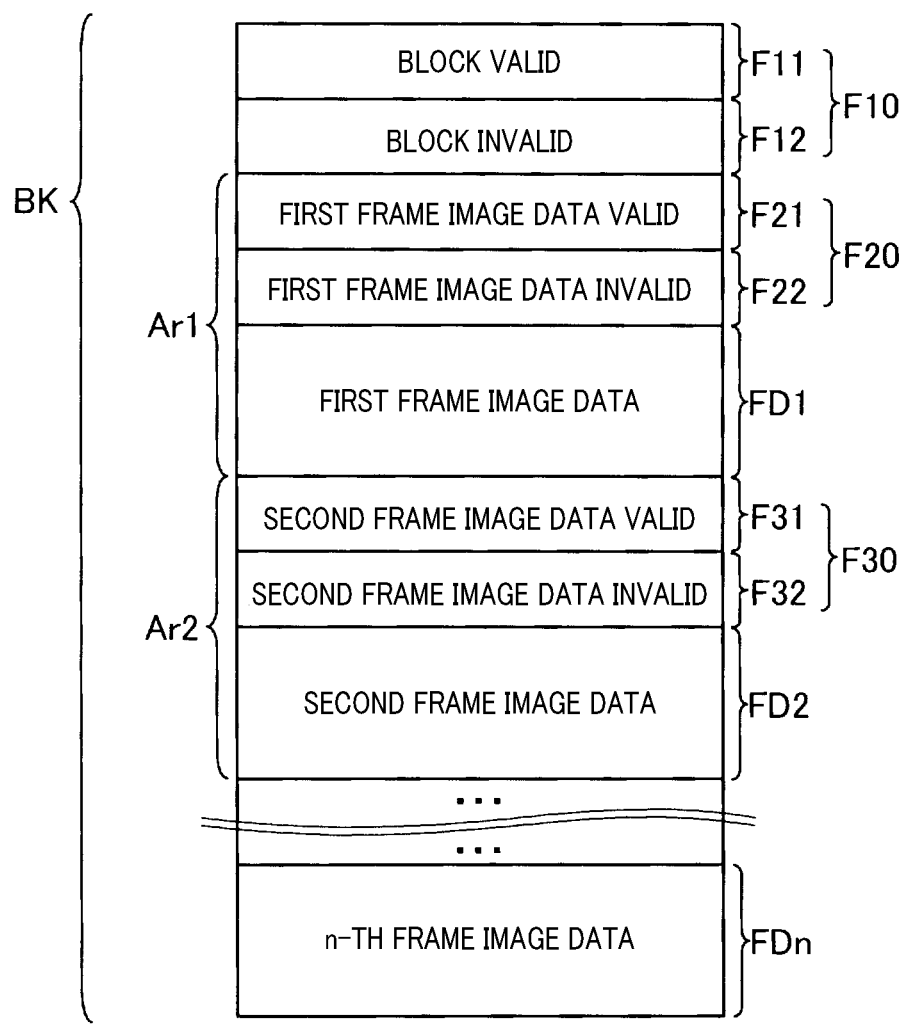
FIG. 2 is an illustrative diagram showing a block configuration of a first memory for data storage.

The memory controller 103 controls writing of data into the first memory 200 and reading of data from the first memory 200. The memory controller 103 writes the data from the second memory 110 into the first memory 200 on a block-by-block basis with a predetermined format. Specifically, the memory controller 103 writes the data into the first memory 200 on a block-by-block basis with a predetermined format of data block BK shown in FIG. 2.

The data block BK includes a predetermined number of frame images and a predetermined number of flags indicating validity of data in a predetermined range. Specifically, the data block BK includes a block validity flag F10, a first frame image validity flag F20, first frame image data FD1, a second frame image validity flag F30, second frame image data FD2, . . . , and n-th frame image data FDn. The block validity flag F10 is formed of a block validity flag F11 and a block invalidity flag F12. The block validity flag F11 is a flag indicating that the data block BK is entirely valid. The block invalidity flag F12 is a flag indicating that the data block BK is not entirely valid. Either one of the two flags F11 and F12 is selectively turned on. The first frame image validity flag F20 is formed of a first frame image validity flag F21 and a first frame image invalidity flag F22. The first frame image validity flag F21 is a flag indicating that the first frame image data FD1 is valid. The first frame image invalidity flag F22 is a flag indicating that the first frame image data FD1 is invalid. Either one of the two flags F21 and F22 is selectively turned on. The first frame image data FD1, the second frame image data FD2, . . . , and the n-th frame image data FDn are frame image data obtained by the image-capturing camera 400. The second frame image validity flag F30 is formed of a second frame image validity flag F31 and a second frame image invalidity flag F32. The second frame image validity flag F31 is a flag indicating that the second frame image data FD2 is valid. The second frame image invalidity flag F32 is a flag indicating that the second frame image data FD2 is invalid. Either one of the two flags F31 and F32 is selectively turned on.

The information receipt unit 104 shown in FIG. 1 receives voltage-related information provided by the power source control device 300 via the signal line 352. The voltage-related information refers to a value related to an output voltage of the power supply device 310. In the present embodiment, the voltage-related information is the value of output voltage of the power supply device 310. The condition determination unit 105 uses the voltage-related information received by the information receipt unit 104 to determine on the satisfaction of a predetermined voltage condition that the output voltage of the power supply device 310 is estimated to become lower than a lower limit-corresponding voltage corresponding to a lower limit in a predetermined voltage range as a normal voltage range of the operating voltage of the data storage control device 100 (hereinafter, simply called "voltage condition"). The voltage condition will be described later in detail.

In the thus configured data storage control device 100, when the vehicle has had a collision as described above, the frame images stored in the second memory 110 are written into the first memory 200 by the data block BK. However, if the remaining capacity of the battery 311 is lower than the lower limit capacity in the event of such a collision or if the connector of the power cable comes off from the battery 311 due to the collision, the power feeding from the battery 311 stops. In this case, instead of the battery 311, the capacitor 312 feeds power but the input voltage to the power source control device 300 gradually decreases with the progress of electrical discharge from the capacitor 312 over time. In such a situation, even if data writing into the first memory 200 is started, the data block BK may be written only partway and corrupted data may be stored in the first memory 200. In this case, when the power feeding to the data storage control device 100 recovers, it is necessary to check all data in the first memory 200 for normality. However, the data storage control device 100 of the present embodiment executes a data storage control process described later, thereby eliminating the need for such a normality check.

A2. Data Storage Control Process

Figure 3:
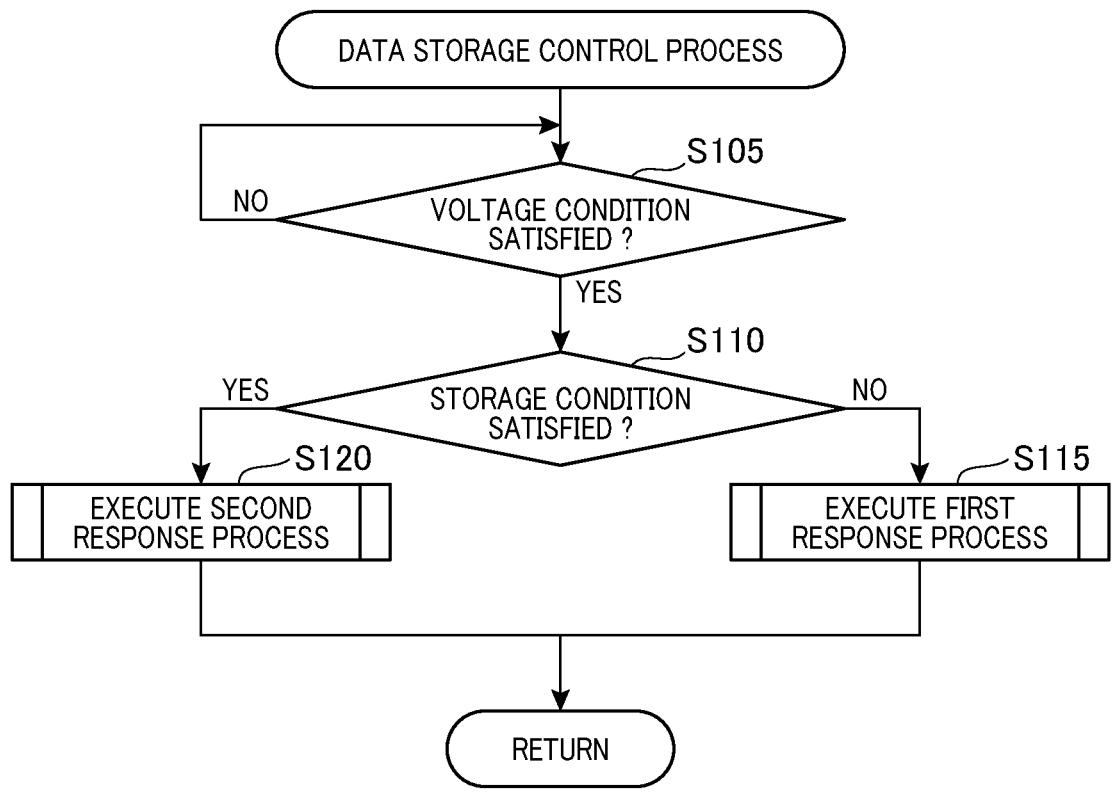
FIG. 3 is a flowchart showing a procedure for a data storage control process in the first embodiment.

The data storage control process shown in FIG. 3 is executed along with the start of power feeding to the data storage control device 100. The condition determination unit 105 uses the voltage-related information received by the information receipt unit 104 to determine whether the voltage condition is satisfied (step S105). As described above, the "voltage condition" is the "predetermined condition that the output voltage of the power supply device 310 is estimated to become lower than the lower limit-corresponding voltage". Specifically, in the present embodiment, the voltage condition is that "the output voltage of the power supply device 310 indicated by the voltage-related information received by the information receipt unit 104 is lower than a first threshold voltage Vth1". In the present embodiment, the lower limit in the normal voltage range of the operating voltage of the data storage control device 100 is 1.0 V. When the voltage supplied to the data storage control device 100 via the power source control device 300 becomes lower than 1.0 V, the data storage control device 100 can no longer function. The output voltage of the power supply device 310 at that time is about 8.0V. The first threshold voltage Vth1 is a predetermined threshold voltage within the normal voltage range of the operating voltage of the data storage control device 100 and is set to a value higher than 8.0 V that is a voltage corresponding to 1.0 V as the lower limit in the normal voltage range (hereinafter, called "lower limit-corresponding voltage"). Specifically, in the present embodiment, the first threshold voltage Vth1 is set to 10 V.

When it is not determined that the voltage condition is satisfied (NO in step S105), the memory controller 103 executes again step S105. That is, the memory controller 103 waits until the voltage condition is satisfied. When it is determined that the voltage condition is satisfied (YES in step S105), that is, when it is determined that the output voltage of the power supply device 310 is lower than 10 V, the memory controller 103 determines whether a predetermined storage condition is satisfied (step S110). The "storage condition" is a condition that residual data as data yet to be written from a currently written data block into the first memory 200 (hereinafter, called "currently written block") is estimated to be writable into the first memory 200 by the time when the output voltage of the power supply device 310 becomes lower than the lower limit-corresponding voltage (8.0 V). Specifically, in the present embodiment, the storage condition is that the amount of residual data is equal to or lower than a predetermined threshold data amount. The upper limit value of the data amount writable into the first memory 200 by the time when the output voltage of the power supply device 310 decreases from 10 V as the first threshold voltage to 8.0 V may be specified in advance by experiment or the like and the data amount may be set as the threshold data amount described above.

Figure 4:
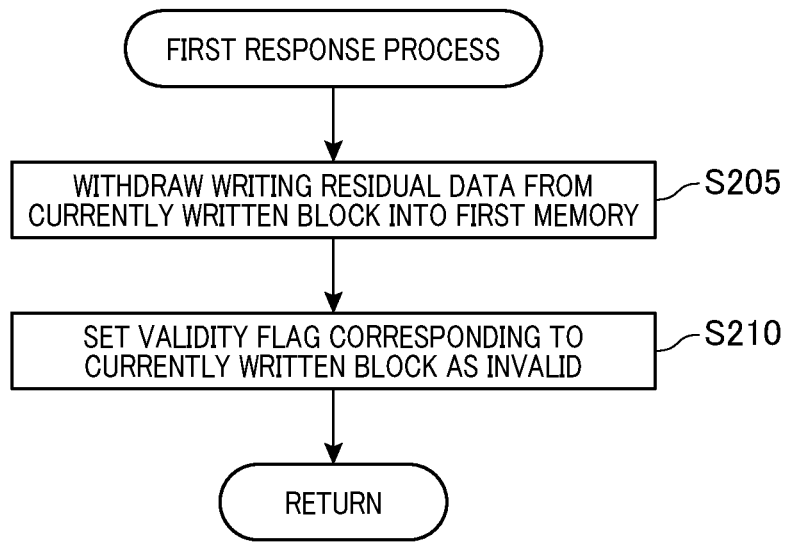
FIG. 4 is a flowchart showing a procedure for a first response process.

When it is not determined that the storage condition is satisfied (NO in step S110), that is, when it is determined that the amount of residual data is larger than the threshold data amount, the memory controller 103 executes a first response process (step S115). As shown in FIG. 4, in the first response process, the memory controller 103 does not write the residual data from the currently written block into the first memory 200 (step S205). The memory controller 103 sets the validity flag corresponding to the currently written block as invalid (step S210). For example, if the currently written block is the data block BK shown in FIG. 2, when determining that the residual data is larger than the threshold data amount, the memory controller 103 turns on the block invalidity flag F12. After execution of step S210, step S115 ends.

Figure 5:
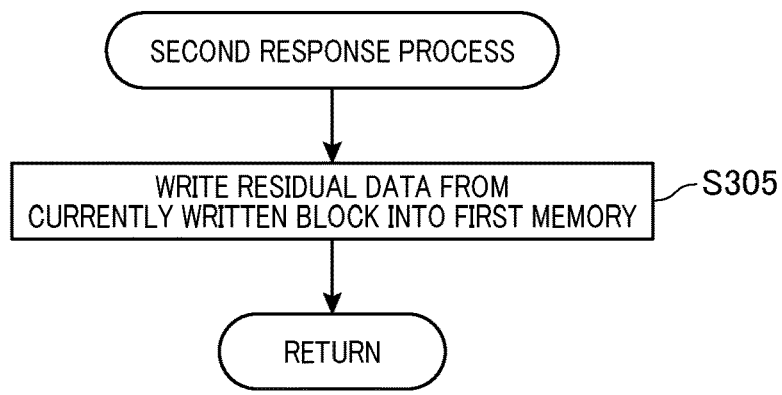
FIG. 5 is a flowchart showing a procedure for a second response process.

As shown in FIG. 3, when determining that the storage condition is satisfied (YES in step S110), that is, when determining that the amount of residual data is equal to or less than the threshold data amount, the memory controller 103 executes a second response process (step S120). As shown in FIG. 5, in the second response process, the memory controller 103 writes the residual data from the currently written block into the first memory 200 (step S305). Therefore, in this case, the memory controller 103 turns on the block validity flag F11. After execution of step S305, step S120 end. As shown in FIG. 3, after execution of step S115 or S120, the process returns to step S105.

According to the data storage control device 100 of the first embodiment described above, when it is determined that the voltage condition is satisfied during execution of the writing process, and when it is not determined that the storage condition is satisfied, the first response process is executed so that the residual data is not written into the first memory 200 and the validity flag F10 corresponding to the currently written block (the data block BK) is set as invalid, thereby making it possible to suppress a situation in which, before all the residual data is written, the output voltage of the power supply device 310 becomes lower than the lower limit-corresponding voltage (8.0 V) and some corrupted data is recorded on the first memory 200. This eliminates the need to perform a normality check on the data block BK when the output voltage of the power supply device 310 recovers afterwards, which leads to shortening of the start time of the system including the first memory 200. The "system including the first memory 200" refers to a system that includes the first memory 200 and the data storage control device 100, for example. In addition, when it is determined that the storage condition is satisfied, the second response process is executed to write the residual data yet to be written from the currently written block (the data block BK) into the first memory 200, whereby the residual data can be normally written into the first memory 200. In this case as well, therefore, there is no need to perform a normality check on the data block BK when the output voltage of the power supply device 310 recovers, which makes it possible to shorten the start time of the first memory 200. In this manner, according to the data storage control device 100 of the first embodiment, it is possible to shorten the start time of the system including the first memory 200 even when the data writing into the first memory 200 is interrupted due to a decrease in the output voltage of the power supply device 310 and the output voltage recovers afterwards.

Since the storage condition includes the condition that the amount of residual data is equal to or less than the predetermined threshold data amount, it is possible to use, as the storage condition, the condition that the residual data is more correctly estimated to be writable into the first memory 200 by the time when the operating voltage of the data storage control device 100 becomes lower than the lower limit voltage (1.0 V). This makes it possible to select and execute a more appropriate one of the first response process and the second response process.

Since the voltage condition includes the condition that the output voltage of the power supply device 310 specified based on the voltage-related information received by the information receipt unit 104 becomes lower than the first threshold voltage (10 V) higher than the lower limit-corresponding voltage (8.0 V), it is possible to use, as the voltage condition, the condition that the output voltage of the power supply device 310 is accurately estimated to become lower than the lower limit-corresponding voltage (8.0 V).

B. Second Embodiment

A data storage control device 100 of a second embodiment is configured in the same manner as the data storage control device 100 of the first embodiment, and thus identical components are denoted with identical reference signs and detailed descriptions thereof are omitted. In the data storage control device 100 of the second embodiment, a data storage control process is executed in the same procedure as in the first embodiment. The data storage control device 100 of the second embodiment is different from the data storage control device 100 of the first embodiment in that a recognition processing unit 102 executes a predetermined process control process shown in FIG. 6.

Figure 6:
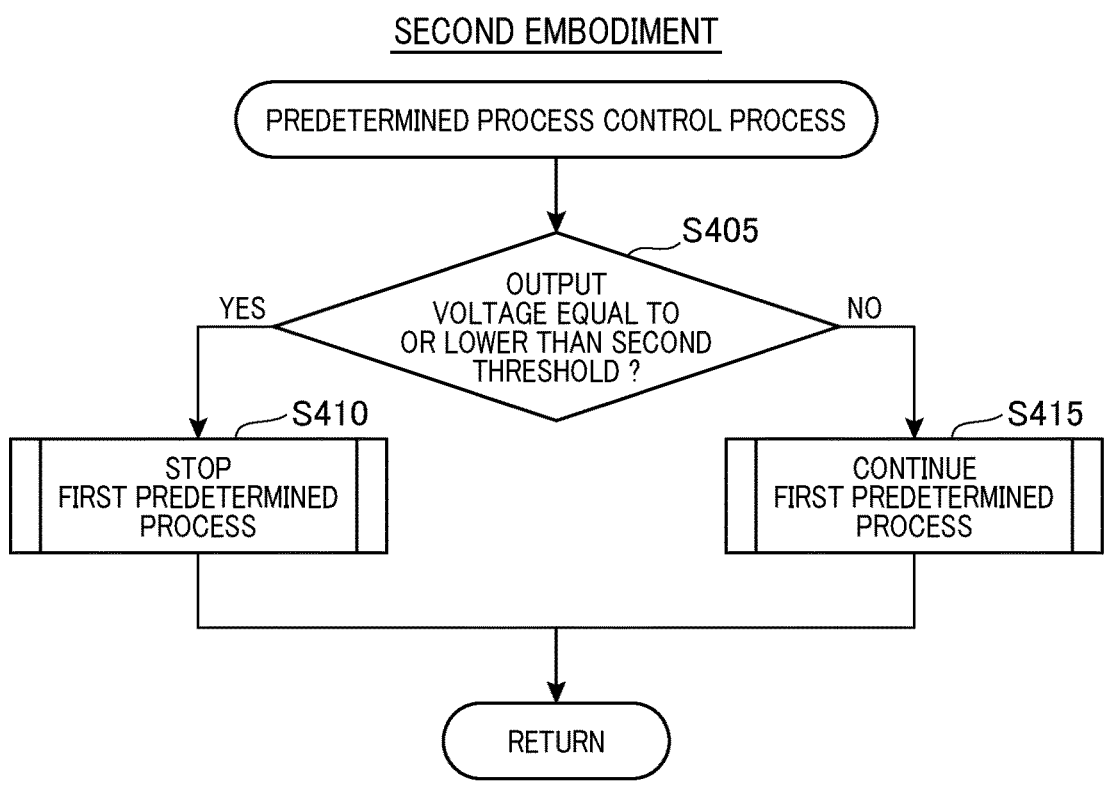
FIG. 6 is a flowchart showing a procedure for a predetermined process control process in a second embodiment.

The predetermined process control process shown in FIG. 6 is a process for controlling the continuance and stop of a predetermined process executed by the data storage control device 100 (hereinafter, called "first predetermined process"). In the present embodiment, the first predetermined process corresponds to a "recognition process" executed by the recognition processing unit 102. The predetermined process control process is executed along with the start of power feeding to the data storage control device 100. The recognition processing unit 102 corresponds to a first predetermined process control unit in the present disclosure.

The recognition processing unit 102 determines whether the output voltage of the power supply device 310 indicated by the voltage-related information received by the information receipt unit 104 is equal to or lower than a second threshold voltage (step S405). The second threshold voltage is a predetermined threshold voltage within a normal voltage range of operating voltage of the data storage control device 100 and is set to a value higher than the lower limit-corresponding voltage 8.0 V corresponding to the lower limit value 1.0 V in the normal voltage range. In the present embodiment, the second threshold voltage is higher than the first threshold voltage described above. For example, the second threshold voltage may be set to 10.5 V. The second threshold voltage is not limited to 10.5 V but may be an arbitrary value higher than the lower limit-corresponding voltage 8.0 V.

When determining that the output voltage of the power supply device 310 is equal to or lower than the second threshold voltage (YES in step S405), the recognition processing unit 102 stops the first predetermined process, that is, the recognition process (step S410). Conversely, when not determining that the output voltage of the power supply device 310 is equal to or lower than the second threshold voltage (NO in step S405), the recognition processing unit 102 continues the first predetermined process, that is, the recognition process (step S415). After execution of steps S410 or S415, the process returns to step S405.

Figure 7:
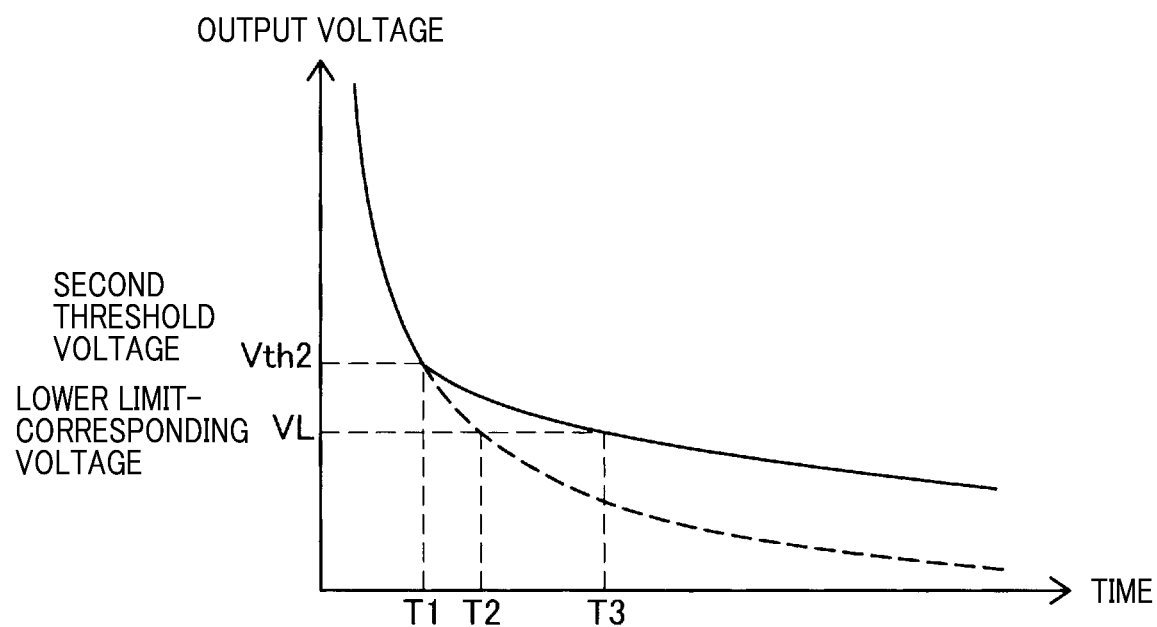
FIG. 7 is an illustrative diagram showing transition of an output voltage of a power supply device in the second embodiment.

FIG. 7 shows time on the lateral axis and the output voltage of the power supply device 310 on the vertical axis. FIG. 7 shows the transition of output voltage of the power supply device 310 in the second embodiment by a solid line and shows the transition of output voltage of a power supply device configured not to execute the predetermined process control process, that is, a power supply device 310 in a comparative example by a broken line. In the second embodiment, when the output voltage decreases to the second threshold voltage Vth2 at time T1, step S410 is executed to stop the recognition process. Thus, the power consumption in the data storage control device 100 decreases, and the discharge amounts of the battery 311 and the capacitor 312 decrease accordingly. As shown by the solid line, time T3 when the output voltage of the power supply device 310 reaches the lower limit-corresponding voltage VL is later than time T2 when the output voltage of the power supply device 310 in the comparative example reaches the lower limit-corresponding voltage VL. That is, according to the second embodiment, it is possible to lengthen the period of time from the instant when the output voltage of the power supply device 310 becomes equal to or lower than the second threshold voltage to the instant when the output voltage of the power supply device 310 becomes lower than the lower limit-corresponding voltage VL.

The data storage control device 100 of the second embodiment described above has the same advantageous effects as those of the data storage control device 100 of the first embodiment. In addition, when the output voltage of the power supply device 310 becomes lower than the second threshold voltage, the first predetermined process, that is, the recognition process under execution is stopped, whereby it is possible to suppress power consumption for the first predetermined process and lengthen the time until the output voltage of the power supply device 310 becomes lower than the lower limit-corresponding voltage (8.0 V). This improves the possibility of the second response process being performed so that the residual data becomes more likely to be written into the first memory 200.

C. Third Embodiment

Figure 8:
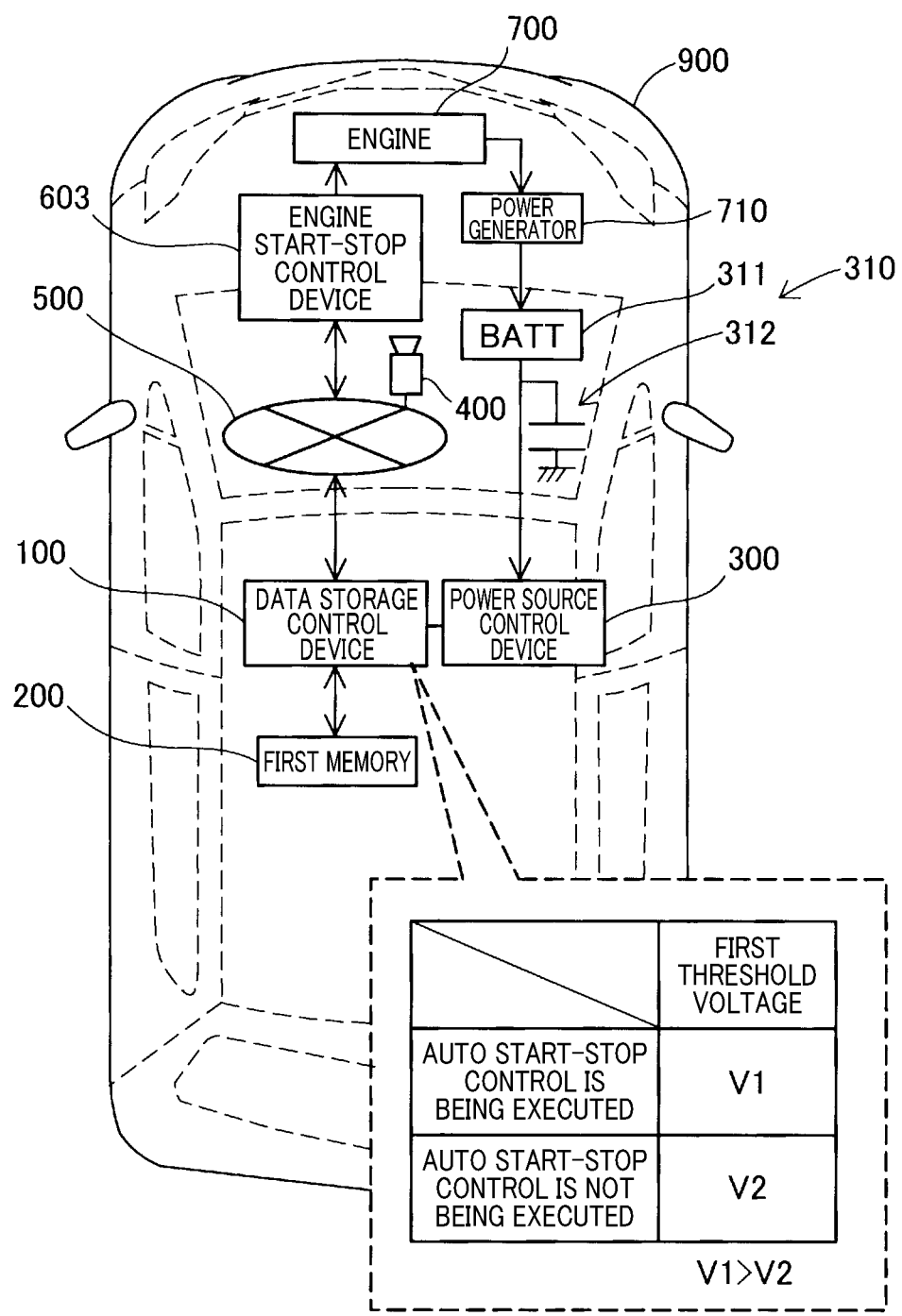
FIG. 8 is a block diagram showing a schematic configuration of a vehicle system including a data storage control device in a third embodiment.

A data storage control device 100 of a third embodiment shown in FIG. 8 is configured in the same manner as the data storage control device 100 of the first embodiment, and thus identical components are denoted with identical reference signs and detailed descriptions thereof are omitted. A vehicle 900 equipped with the data storage control device 100 of the third embodiment includes the first memory 200, the image-capturing camera 400, the CAN 500, the control device group 600, the power source control device 300, the power supply device 310, the ignition key 330, the power line 351, and the signal line 352 shown in FIG. 1, and also includes an auto start-stop control device 603, an engine 700, and a power generator 710. FIG. 8 does not show the control device group 600, the ignition key 330, the power line 351, and the signal line 352 for the sake of illustration.

The auto start-stop control device 603 executes auto start-stop control (also called "idle stop and go"). Specifically, when a predetermined condition is satisfied, the auto start-stop control device 603 stops the engine 700. After that, when a predetermined condition is satisfied, the auto start-stop control device 603 restarts the engine 700. The auto start-stop control device 603 constitutes part of the control device group 600 and is formed of an ECU like the millimeter-wave radar control device 601 and the Lidar control device 602.

The power generator 710 is driven by the engine 700 to generate power and charge the generated power into the battery 311. While the engine 700 is stopped under the auto start-stop control, the power generator 710 generates no power so that the battery 311 is not charged. Thus, the remaining capacity of the battery 311 keeps on decreasing.

The data storage control device 100 of the present embodiment has two values of the first threshold voltage. Specifically, as shown in FIG. 8, the first threshold voltage is set to a voltage V1 under execution of the auto start-stop control, and the first threshold voltage is set to a voltage V2 not under execution of the auto start-stop control. In the present embodiment, the voltage V1 is higher than the voltage V2.

As described above, the first threshold voltage is a voltage that is used for the voltage condition, that is, the condition that "the output voltage of the power supply device 310 indicated by the voltage-related information received by the information receipt unit 104 is lower than the first threshold voltage". The higher the first threshold voltage is, the higher the possibility of satisfaction of the voltage condition becomes. On the other hand, the lower the first threshold voltage is, the lower the possibility of satisfaction of the voltage condition becomes. The voltage V1 as the first threshold voltage under execution of the auto start-stop control is higher than the voltage V2 as the first threshold voltage not under execution of the auto start-stop control. Thus, the possibility of satisfaction of the voltage condition under execution of the auto start-stop control becomes higher than that not under execution of the auto start-stop control. This makes it earlier to execute the determination on whether the storage condition is satisfied (step S110) as compared to the configuration in which the first threshold voltage is set to a single voltage regardless of whether the auto start-stop control is being executed.

The data storage control device 100 of the third embodiment described above has the same advantageous effects as those of the data storage control device 100 of the first embodiment. In addition, the first threshold voltage Vth1 under execution of the auto start-stop control is set to the higher voltage V1 than that not under execution of the auto start-stop control. This makes it earlier to determine whether the storage condition is satisfied. Under execution of the auto start-stop control, the engine 700 is generally not driven so that the power generator 710 generates no power. Accordingly, the speed of decrease in the output voltage of the battery 311 is higher than that not under execution of the auto start-stop control. However, according to the data storage control device 100 of the third embodiment, it is determined earlier whether the storage condition is satisfied.

This makes it possible to increase the possibility of execution of the second response process, so that the entire currently written block is more likely to be normally written into the first memory 200.

D. Fourth Embodiment

A data storage control device 100 of a fourth embodiment is configured in the same manner as the data storage control device 100 of the first embodiment, and thus identical components are denoted with identical reference signs and detailed descriptions thereof are omitted. The vehicle equipped with the data storage control device 100 of the fourth embodiment includes an auto start-stop control device 603, an engine 700, a power generator 710, and others, like the vehicle of the third embodiment shown in FIG. 8. The data storage control device 100 of the fourth embodiment is different from the data storage control device 100 of the first embodiment in a detailed procedure for a data storage control process.

Specifically, the data storage control process of the fourth embodiment is different from those performed by the data storage control devices 100 of the first and third embodiments, in step S110, that is, in a method for determining whether the storage condition is satisfied, and is the same as the data storage control processes in the first and third embodiments in the other steps of the method. In the first embodiment, the storage condition is that "the amount of residual data is equal to or less than the predetermined threshold data amount", whereas in the fourth embodiment, the storage condition is that "the auto start-stop control is not being executed".

In step S110, a memory controller 103 determines whether the auto start-stop control is being executed. When determining that the auto start-stop control is being executed, the memory controller 103 determines that the storage condition is not satisfied (NO in step S110). Conversely, when not determining that the auto start-stop control is being executed, the memory controller 103 determines that the storage condition is satisfied (YES in step S110).

When determining that the auto start-stop control is being executed, that is, when determining that the storage condition is not satisfied, the memory controller 103 executes step S115 described above. In this case, therefore, the residual data is not written into a first memory 200, and a validity flag corresponding to the currently written block is set as invalid.

Figure 9:
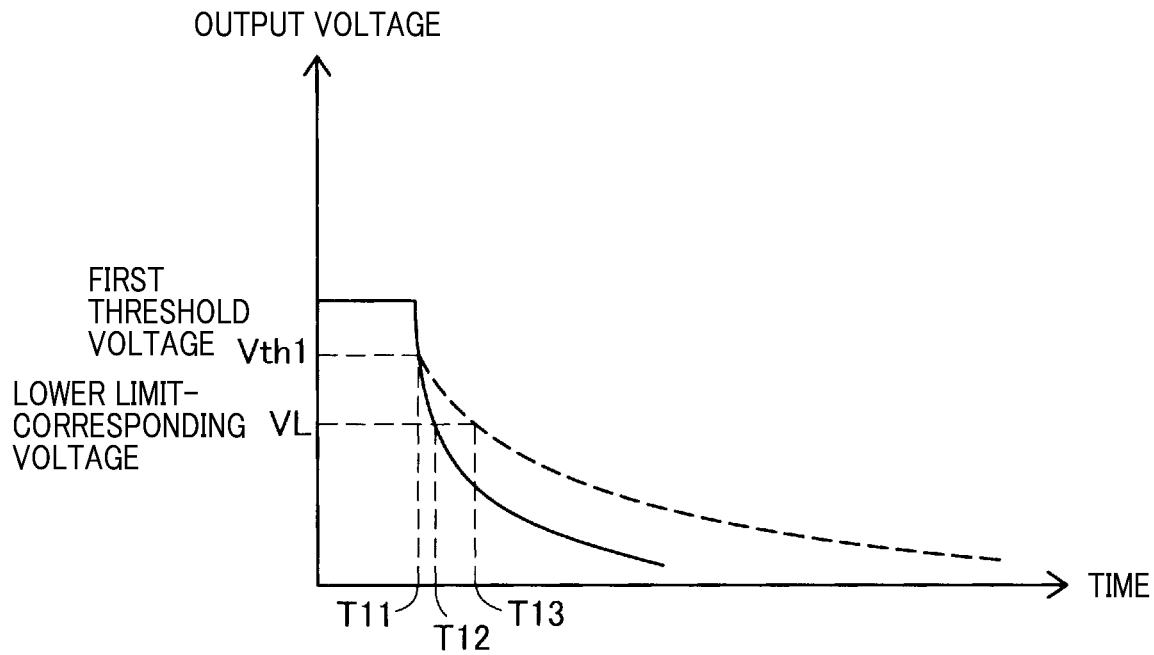
FIG. 9 is an illustrative diagram showing transition of a supply voltage supplied from a power source control device to a data storage device in a fourth embodiment.

When the auto start-stop control is being executed, the engine 700 is not driven so that the power generator 710 generates no power. Thus, the speed of decrease in the output voltage of a battery 311 is high. FIG. 9 shows, by a solid line, the transition of output voltage of the power supply device 310 under execution of the auto start-stop control, and shows, by a broken line, the transition of output voltage of the power supply device 310 not under execution of the auto start-stop control. Shortly before time T11, the output voltage of the battery 311 becomes zero and a capacitor 312 starts power feeding. At time T11, the output voltage becomes lower than a first threshold voltage Vth1 so that the voltage condition is satisfied. When the auto start-stop control is being executed, the output voltage sharply decreases and then drops down to the lower limit-corresponding voltage VL at time T12, as shown by the solid line in FIG. 9. Thus, the writing of the residual data into the first memory 200 may not complete before the output voltage of the power supply device 310 becomes lower than the lower limit-corresponding voltage. In such a case, however, the data storage control device 100 of the fourth embodiment does not write the residual data into the first memory 200 but sets the validity flag corresponding to the currently written block as invalid as described above. This makes it possible to suppress some corrupted data from being written into the first memory 200 and eliminate the need to perform a normality check on at least the entire applicable data block after the recovery of the power.

In contrast, when not determining that the auto start-stop control is being executed, that is, when determining that the storage condition is satisfied, the memory controller 103 executes step S120 described above. In this case, therefore, the residual data is written into the first memory 200. When the auto start-stop control is not being executed, the engine 700 is driven so that the power generator 710 generates power. Thus, the speed of decrease in the output voltage of the battery 311 is low. As shown by the broken line in FIG. 9, the period from the time T11 when the output voltage of the power supply device 310 decreases to the first threshold voltage Vth1 to time T13 when the output voltage of the power supply device 310 decreases to the lower limit-corresponding voltage VL is longer than the period from the time T11 to the time T12. In this case, therefore, there is a high possibility that the residual data will be written into the first memory 200. Accordingly, writing the residual data into the first memory 200 makes it possible to write the entire applicable data block into the first memory 200.

The data storage control device 100 of the fourth embodiment described above has the same advantageous effects as those of the data storage control devices 100 of the first and third embodiments. In addition, the first response process is performed under execution of the auto start-stop control. Accordingly, even if the speed of decrease in the output voltage of the power supply device 310 is high due to the execution of the auto start-stop control, it is possible to suppress a situation in which the writing of the residual data into the first memory 200 cannot complete and some corrupted data is recorded in the first memory 200. On the other hand, when the auto start-stop control is not being executed, the second response process is executed so that the residual data can be written into the first memory 200. Further, the storage condition includes the condition that "the auto start-stop control is not being executed", which makes it easy to determine whether the storage condition is satisfied.

E. Fifth Embodiment

A data storage control device 100 of a fifth embodiment is configured in the same manner as the data storage control device 100 of the first embodiment, and thus identical components are denoted with identical reference signs and detailed descriptions thereof are omitted. The data storage control device 100 of the fifth embodiment is different from the data storage control device 100 of the first embodiment in a detailed procedure for a data storage control process.

Specifically, the data storage control process of the fifth embodiment is different from that performed by the data storage control devices 100 of the first embodiment in step S110, that is, in a method for determining whether the storage condition is satisfied, and is the same as the data storage control process of the first embodiment in the other steps of the method. In the first embodiment, the storage condition is that "the amount of residual data is equal to or less than the predetermined threshold data amount", whereas in the fifth embodiment, the storage condition is that "the writing of a target data block has completed before the output voltage becomes equal to or lower than a third threshold voltage". The third threshold voltage is a voltage that is higher than a lower limit-corresponding voltage VL and is lower than a first threshold voltage Vth1.

In step S110, a memory controller 103 determines whether the writing of the target data block has completed before the output voltage becomes equal to or lower than the third threshold voltage. When not determining that the writing has completed, the memory controller 103 determines that the storage condition is not satisfied (NO in step S110). Conversely, when determining that the writing has completed, the memory controller 103 determines that the storage condition is satisfied (YES in step S110).

When not determining that the writing of the target data block has completed before the output voltage becomes equal to or lower than the third threshold voltage, that is, when determining that the storage condition is not satisfied, the memory controller 103 executes step S115 described above. In this case, therefore, the residual data is not written into the first memory 200, and a validity flag corresponding to the currently written block is set as invalid.

Figure 10:
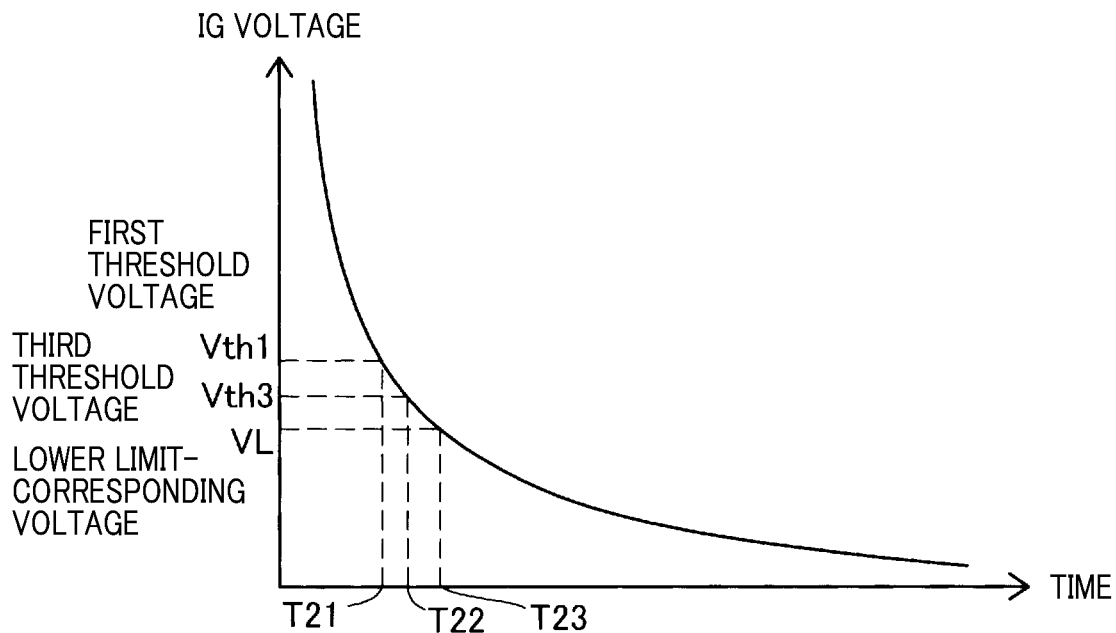
FIG. 10 is an illustrative diagram showing transition of an output voltage of a power supply device in a fifth embodiment.

As shown in FIG. 10, when the data writing has not completed within the period from time T21 when the output voltage of a power supply device 310 decreases to the first threshold voltage Vth1 to time T22 when the output voltage decreases to the third threshold voltage Vth3, the writing of the residual data into the first memory 200 may not complete before the output voltage becomes lower than the lower limit-corresponding voltage. In other words, the time T22 when there arises a possibility that the writing of the residual data into the first memory 200 may not complete is specified by experiment or the like, the output voltage of the power supply device 310 at the time T22 is specified, and the output voltage is specified and set as the third threshold voltage Vth3.

In contrast to this, when determining that the writing of the target data block has completed before the output voltage becomes equal to or lower than the third threshold voltage, that is, when determining that the storage condition is satisfied, the memory controller 103 executes step S120 described above. In this case, therefore, the residual data is written into the first memory 200. Since the writing of the residual data has completed before the time T22 shown in FIG. 10, step S120 does not need to be executed again.

The data storage control device 100 of the fifth embodiment described above has the same advantageous effects as those of the data storage control device 100 of the first embodiment. In addition, the storage condition includes the condition that the writing process has completed before the output voltage of the power supply device 310 becomes equal to or lower than the third threshold voltage Vth3 higher than the lower limit-corresponding voltage VL, which makes it easy to determine whether the storage condition is satisfied.

F. Sixth Embodiment

A data storage control device 100 of a sixth embodiment is configured in the same manner as the data storage control device 100 of the first embodiment, and thus identical components are denoted with identical reference signs and detailed descriptions thereof are omitted. The data storage control device 100 of the sixth embodiment is different from the data storage control device 100 of the first embodiment in a detailed procedure for a data storage control process.

Specifically, the data storage control process of the sixth embodiment is different from that performed by the data storage control devices 100 of the first embodiment in step S110, that is, in a method for determining whether the storage condition is satisfied, and is the same as the data storage control process of the first embodiment in the other steps of the method. In the first embodiment, the storage condition is that "the amount of residual data is equal to or less than the predetermined threshold data amount", whereas in the sixth embodiment, the storage condition is a condition that "it is determined that data writing can complete before the output voltage decreases to a lower limit-corresponding voltage VL, by use of output voltage values at two times after the output voltage becomes lower than a first threshold voltage Vth1 and the amounts of residual data at the two times".

Figure 11:
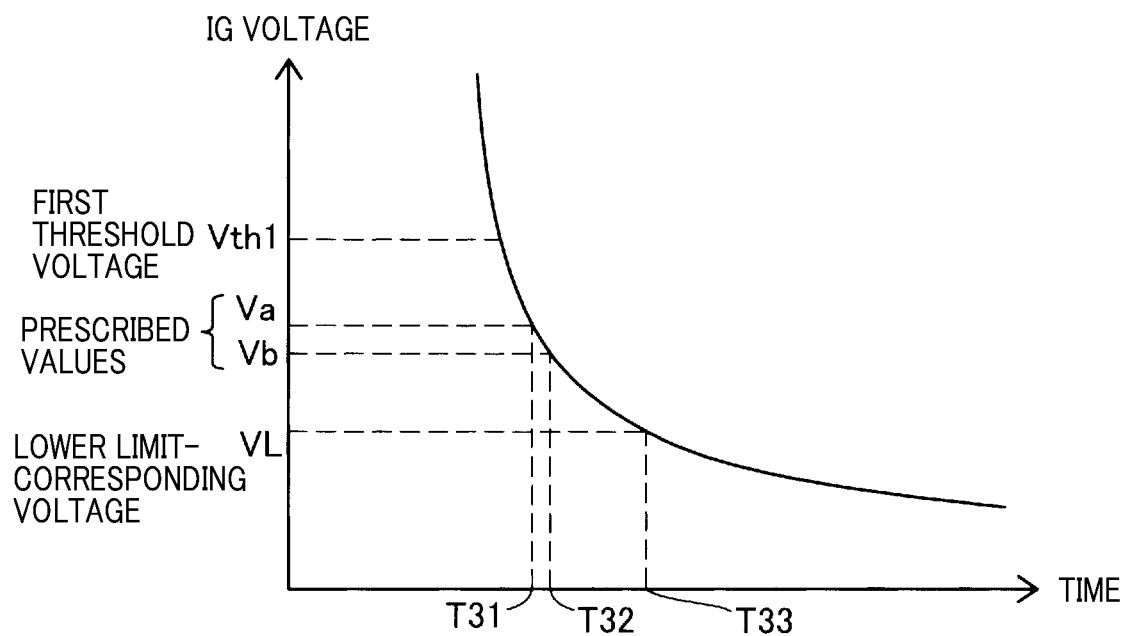
FIG. 11 is an illustrative diagram showing transition of an output voltage of a power supply device in a sixth embodiment.

In step S110, the memory controller 103 specifies the times when the output voltage becomes two prescribed value Va and Vb equal to or lower than the first threshold voltage Vth1. Referring to FIG. 11, specified are time T31 when the output voltage becomes the voltage Va and time T32 when the output voltage becomes the voltage Vb. The memory controller 103 specifies the amounts of the residual data at the two specified times T31 and T32. Then, the memory controller 103 uses the output voltages and the residual data amounts at the two times T31 and T32 to determine whether all the residual data specified at the time T32 is writable within a residual time from the time T32 to the time T33 during which the output voltage decreases to the lower limit-corresponding voltage VL. For example, based on the assumption that the transition of the output voltage takes on a linear shape, the memory controller 103 specifies the time when the output voltage decreases from the values at the two times T31 and T32 to the lower limit-corresponding voltage VL. Similarly, based on the assumption that the transition of amount of residual data takes on a linear shape, the memory controller 103 specifies the time when the residual data becomes zero from the amounts of the residual data at the two times T31 and T32. When the time when the residual data becomes zero is earlier than the time when the output voltage decreases to the lower limit-corresponding voltage VL, the memory controller 103 determines that the writing of the residual data can complete within the residual time and thus determines that the storage condition is satisfied. In this case, the memory controller 103 executes step S120 described above.

In contrast to this, when the time when the residual data becomes zero is later than the time when the output voltage decreases to the lower limit-corresponding voltage VL, the memory controller 103 does not determine that the writing of the residual data can complete within the residual time and thus determines that the storage condition is not satisfied. In this case, the memory controller 103 executes step S115 described above.

The data storage control device 100 of the sixth embodiment described above has the same advantageous effects as those of the data storage control device 100 of the first embodiment. In addition, the storage condition includes the condition that the writing of the residual data can complete within the residual time, thereby making it possible to determine accurately whether the storage condition is satisfied.

G. Seventh Embodiment

A data storage control device 100 of a seventh embodiment is configured in the same manner as the data storage control device 100 of the first embodiment, and thus identical components are denoted with identical reference signs and detailed descriptions thereof will be omitted. In the data storage control device 100 of the seventh embodiment, a data storage control process is executed in the same manner as in the first embodiment. The data storage control device 100 of the seventh embodiment is different from the data storage control device 100 of the first embodiment in that a memory controller 103 executes a data erasure control process shown in FIG. 12.

The data erasure control process shown in FIG. 12 is executed when data erasure from the first memory 200 is started. The data erasure process is a process for, if the output of a power supply device 310 becomes lower than a first threshold voltage Vth1 in the course of data erasure from the first memory 200, controlling data writing executed at data erasure in the same manner as in the data writing control process of the first embodiment. The "data writing executed at data erasure" means that, if only partial data is erased from the data block, for example, the original data block is overwritten by a new data block resultant from the erasure of the partial data.

The memory controller 103 determines whether a voltage condition is satisfied during data erasure from the first memory 200 (step S505). The voltage condition is the same as the voltage condition in the data storage control process of the first embodiment described above.

When determining that the voltage condition is not satisfied during the data erasure from the first memory 200 (NO in step S505), the memory controller 103 executes again step S505. That is, the memory controller 103 waits until the voltage condition is satisfied. Conversely, when determining that the voltage condition is satisfied during the data erasure from the first memory 200 (YES in step S505), the memory controller 103 interrupts the data erasure (step S510). The memory controller 103 sets the validity flag as invalid for the currently erased data block (step S515). For example, when the voltage condition is satisfied during erasure of the data block BK shown in FIG. 2, the data erasure is interrupted and the block invalidity flag F12 is turned on.

The data storage control device 100 of the seventh embodiment described above has the same advantageous effects as those of the data storage control device 100 of the first embodiment. In addition, when it is determined that the voltage condition is satisfied during data erasure from the first memory 200, the erasure is interrupted and the validity flag is set as invalid for the currently erased data block. Accordingly, it is possible to suppress a situation in which, while the data in the data block from which the erasure target part is erased is overwritten on the original data block, the output voltage of the power supply device 310 becomes lower than the lower limit-corresponding voltage VL before the overwriting of all data is completed and some corrupted data is recorded in the first memory 200. Thus, when the output voltage of the power supply device 310 recovers afterwards, there is no need to perform a normality check on the data block, thereby shortening the start time of the system including the first memory 200.

H. Eighth Embodiment

The eighth embodiment is different from the first embodiment in that, among control devices constituting a control device group 600, a millimeter-wave radar control device 601 and a Lidar control device 602 are also subjected to a data storage control process as well as a data storage control device 100. Like the data storage control device 100, the millimeter-wave radar control device 601 and the Lidar control device 602 are both supplied power from a power supply device 310 via the data storage control device 100. The millimeter-wave radar control device 601 and the Lidar control device 602 have detection data temporarily stored in their respective internal memories. When the condition that the vehicle has had a collision is satisfied, the data from the internal memories is stored in a non-volatile memory formed separately from the millimeter-wave radar control device 601 and the Lidar control device 602. As shown in FIG. 13, in the eighth embodiment, a data storage control system 800 is installed in the vehicle, including the data storage control device 100, the millimeter-wave radar control device 601, and the Lidar control device 602.

As shown in FIG. 13, a voltage Vb that is the value of a first threshold voltage Vth1 set to the millimeter-wave radar control device 601 and a voltage Vc that is the value of the first threshold voltage Vth1 set to the Lidar control device 602 are both higher than a voltage Va that is the value of the first threshold voltage Vth1 set to the data storage control device 100. Therefore, when the output voltage of the power supply device 310 starts to decrease, the voltage condition is first satisfied in the millimeter-wave radar control device 601 and the Lidar control device 602 so that the first response process or the second response process is executed. In other words, the voltage condition is satisfied later and the first response process or the second response process is executed later in the data storage control device 100. This allows a recognition processing unit 102 to execute a recognition process later by using the results of detection by the millimeter-wave radar and light detection and ranging (Lidar), thereby lengthening the executable time of a recognition process. In addition, when the millimeter-wave radar control device 601 and the Lidar control device 602 first execute the first response process, the power required for the millimeter-wave radar control device 601 and the Lidar control device 602 to perform data writing can be reduced, thereby to lengthen the executable time of the recognition process by the data storage control device 100.

In the eighth embodiment, a process of transmitting the result of detection by the millimeter-wave radar from the millimeter-wave radar control device 601 via a CAN 500 to the data storage control device 100 and a process of transmitting the result of detection by the Lidar from the Lidar control device 602 via the CAN 500 to the data storage control device 100 correspond to a second predetermined process in the present disclosure. The millimeter-wave radar control device 601 and the Lidar control device 602 correspond to a first device in the present disclosure, the data storage control device 100 corresponds to a second device in the present disclosure, and the detection data from the millimeter-wave radar control device 601 and the Lidar control device 602 correspond to basic data in the present disclosure.

The data storage control device 100, the millimeter-wave radar control device 601, and the Lidar control device 602 of the eighth embodiment described above have the same advantageous effects as those of the data storage control device 100 of the first embodiment. In addition, the voltage Va as the first threshold voltage Vth1 in the data storage control device 100 is lower than the voltages Vb and Vc as the first threshold voltage Vth1 in the millimeter-wave radar control device 601 and the Lidar control device 602, which makes it possible to delay the timing at which the voltage condition is satisfied in the data storage control device 100 as compared to the timing at which the voltage condition is satisfied in the millimeter-wave radar control device 601 and the Lidar control device 602. This lengthens the period during which the recognition process is executable in the data storage control device 100. After the transmission of the detection data, the millimeter-wave radar control device 601 and the Lidar control device 602 may execute the first response process or the second response process. Accordingly, it is possible to determine whether the voltage condition is satisfied earlier in the millimeter-wave radar control device 601 and the Lidar control device 602 and increase the possibility of the second response process being executed, so that the detection data can be normally written into the non-volatile memory.

I. Other Embodiments (I1) In the foregoing embodiments, the "voltage-related information" refers to the output voltage value of the power supply device 310, but the present disclosure is not limited to this. For example, if the power source control device 300 is configured to determine whether "the output voltage of the power supply device 310 is lower than the first threshold voltage Vth1" and transmit information indicating the result of the determination to the data storage control device 100 via the signal line 352, the "information indicating the result of the determination" corresponds to the voltage-related information in the present disclosure. In this configuration, an interrupt line may be provided between the power source control device 300 and the data storage control device 100 so that, when the output voltage of the power supply device 310 is lower than the first threshold voltage Vth1, a predetermined signal is transmitted to the interrupt line. In this configuration, the predetermined signal corresponds to the voltage-related information in the present disclosure.

(I2) The "first predetermined process" in the second embodiment is the recognition process, but the present disclosure is not limited to this. For example, when the control devices constituting the control device group 600, for example, the data storage control device 100, the millimeter-wave radar control device 601, and the Lidar control device 602 may be configured to regularly transmit and receive packets to and from one another via the CAN 500 to verify whether they are kept alive, a process in relation to such keep-alive verification may be the first predetermined process. In this configuration, when the output voltage of the power supply device 310 becomes equal to or lower than the second threshold voltage, the process in relation to keep-alive verification is stopped. This makes it possible to suppress power consumption for this process and lengthen the time until the output voltage of the power supply device 310 becomes lower than the lower limit-corresponding voltage (8.0 V). The first predetermined process may be not only the recognition process and the process in relation to keep-alive verification but also an arbitrary process executed by the data storage control device 100 different from the data writing process into the first memory 200, the first response process, and the second response process.

(I3) In all the embodiments except for the seventh embodiment, the data storage control process may be executed in erasing data from the first memory 200. As described above in relation to the seventh embodiment, since data writing into the first memory 200 is executed even at the time of data erasure, the data storage control process may be applied to such data writing.

(I4) In the foregoing embodiments, the type of the data that is temporarily written into the second memory 110 of the data storage control device 100 and then is written into the first memory 200 when the predetermined condition is satisfied is the frame image data obtained through image capturing by the image-capturing camera 400. However, the present disclosure is not limited to this. For example, the data type may be data related to the attachment position of the image-capturing camera 400, vehicle velocity data, data indicating the states of various switches, or data indicating dialog information. The dialog information refers to, for example, results of a diagnosis process to be executed regularly or when a predetermined condition is satisfied.

(I5) In the foregoing embodiments, the "predetermined condition" as a trigger for the start of the process of reading the data from the second memory 110 and writing and storing the same in the first memory 200 is that "the vehicle has had a collision". However, the present disclosure is not limited to this. For example, when data writing into the first memory 200 is regularly executed, the condition may be that "the time scheduled for the next writing has come". Otherwise, the condition may be that, for example, "the driver has performed an operation to instruct for data writing into the first memory 200". That is, in general, an arbitrary condition may be the "predetermined condition".

(I6) In the foregoing embodiments, the data storage control device 100 and the first memory 200 are mounted in a vehicle, but the present disclosure is not limited to this. Besides vehicles, the data storage control device 100 and the first memory 200 may be mounted in arbitrary kinds of movable bodies such as ships and planes. Further, besides moving bodies, the data storage control device 100 and the first memory 200 may be installed in a building or the like. The power supply device 310 includes both the battery 311 and the capacitor 312 but instead may include only either of them.

(I7) The data storage control device 100 and its method described in relation to the present disclosure may be implemented by a dedicated computer that is provided by forming a processor and a memory programmed to execute one or more functions embodied by a computer program. Otherwise, the data storage control device 100 and its method described in relation to the present disclosure may be implemented by a dedicated computer that is provided by forming a processor from one or more dedicated hardware logic circuits. Alternatively, the data storage control device 100 and its method described in relation to the present disclosure may be implemented by one or more dedicated computers that are formed by a combination of a processor and a memory programmed to execute one or more functions and one or more hardware logic circuits. The computer program may be stored as instructions to be executed by a computer in a computer-readable non-transitory tangible recording medium.

The functions of a single component may be distributed to a plurality of components, or the functions of a plurality of components may be integrated into a single component. At least part of the configuration of the above embodiments may be replaced with a known configuration having a similar function. At least part of the configuration of the above embodiments may be removed. At least part of the configuration of one of the above embodiments may be replaced with or added to the configuration of another one of the above embodiments. While only certain features of the disclosure have been illustrated and described herein, many modifications and changes will occur to those skilled in the art. It is, therefore, to be understood that the appended claims are intended to cover all such modifications and changes as falling within the true spirit of the disclosure.

What is claimed is:

1. A data storage control device for writing data into a first memory that is a non-volatile memory, the data storage control device comprising:
a second memory that is different from the first memory;
a memory controller configured to execute a writing process of writing the data from the second memory into the first memory on a block-by-block basis with a predetermined data size;

an information receipt unit configured to receive voltage-related information that relates to an output voltage of a power supply device from a power source control device that supplies an operating voltage to the data storage control device by use of the output voltage of the power supply device; and a condition determination unit configured to, using the received voltage-related information, determine whether a predetermined voltage condition is satisfied, the voltage condition being that the output voltage is estimated to become lower than a lower limit-corresponding voltage corresponding to a lower limit voltage in a predetermined voltage range that is predetermined as a normal voltage range of the operating voltage, wherein the data block stored in the first memory includes data stored in the second memory and a validity flag that indicates validity of the data, and the memory controller is configured to:

in response to the condition determination unit determining that the voltage condition is satisfied during execution of the writing process, determine whether a predetermined storage condition is satisfied, the storage condition being that residual data yet to be written in a currently written block that is currently being written is estimated to be writable into the first memory by the time when the output voltage becomes lower than the lower limit-corresponding voltage;

in response to determining that the storage condition is not satisfied, execute a first response process of withdrawing writing the residual data into the first memory but setting the validity flag corresponding to the currently written block as invalid; and in response to determining that the storage condition is satisfied, execute a second response process of writing the residual data yet to be written from the currently written block into the first memory.

2. The data storage control device according to claim 1, wherein the memory controller is configured to, in response to the condition determination unit determining that the voltage condition is satisfied during the execution of the writing process, specify an amount of residual data, and the storage condition includes a condition that the amount of residual data is equal to or less than a predetermined threshold data amount.

3. The data storage control device according to claim 1, wherein the voltage condition includes a condition that the output voltage specified based on the voltage-related information becomes lower than a first threshold voltage that is a predetermined threshold voltage within the voltage range and higher than the lower limit-corresponding voltage.

4. The data storage control device according to claim 3, further comprising a first predetermined process control unit configured to control execution of a first predetermined process different from the writing process, the first response process, and the second response process, the first predetermined process control unit being configured to, in response to the output voltage specified based on the voltage-related information becoming equal to or lower than a second threshold voltage that is a predetermined threshold voltage within the voltage range and higher than the lower limit-corresponding voltage, stop the first predetermined process under execution.

5. The data storage control device according to claim 3, wherein the power supply device includes a battery, the data storage control device is mounted to a vehicle equipped with the power supply device, an engine, a power generator that generates electric power by being driven by the engine and charges the power into the battery, and an auto start-stop control device that executes auto start-stop control, and the first threshold voltage is set to a higher voltage value under execution of the auto start-stop control than not under execution of the auto start-stop control.

6. The data storage control device according to claim 1, wherein the power supply device includes a battery, the data storage control device is mounted to a vehicle equipped with the power supply device, an engine, a power generator that generates electric power by being driven by the engine and charges the power into the battery, and an auto start-stop control device that executes auto start-stop control, and the storage condition includes a condition that the auto start-stop control is not being executed.

7. The data storage control device according to claim 1, wherein the storage condition includes a condition that the writing process has completed before the output voltage specified based on the voltage-related information becomes equal to or lower than a third threshold voltage that is a predetermined threshold voltage within the voltage range and higher than the lower limit-corresponding voltage.

8. The data storage control device according to claim 1, wherein the memory controller is configured to specify a residual time that is an amount of time which will elapse until the output voltage becomes lower than the lower limit voltage based on the voltage-related information received at least two times, and use the residual time and the amount of residual data to determine whether the writing of the residual data can be completed within the residual time, and the storage condition includes a condition that the writing of the residual data can be completed within the residual time.

9. The data storage control device according to claim 1, wherein the memory controller is configured to, in response to the condition determination unit determining that the voltage condition is satisfied during erasure of data from the first memory, interrupt the erasure and set the validity flag as invalid for a currently erased data block that is currently being erased.

10. A data storage control system comprising a plurality of data storage control devices that are mutually communicable and each configured to write data into a first memory that is a non-volatile memory, each of the plurality of data storage control devices comprising:

a second memory that is different from the first memory;

a memory controller configured to execute a writing process of writing the data from the second memory into the first memory on a block-by-block basis with a predetermined data size;

an information receipt unit configured to receive voltage-related information that relates to an output voltage of a power supply device from a power source control device that supplies an operating voltage to the data storage control device by use of the output voltage of the power supply device; and a condition determination unit configured to, using the received voltage-related information, determine whether a predetermined voltage condition is satisfied, the voltage condition being that the output voltage specified based on the voltage-related information becomes lower than a first threshold voltage that is a predetermined threshold voltage within a predetermined voltage range that is predetermined as a normal voltage range of the operating voltage, the predetermined threshold voltage being higher than a lower limit-corresponding voltage corresponding to a lower limit voltage in the predetermined voltage range, wherein the data block stored in the first memory includes data stored in the second memory and a validity flag that indicates validity of the data, and the memory controller is configured to:

in response to the condition determination unit determining that the voltage condition is satisfied during execution of the writing process, determine whether a predetermined storage condition is satisfied, the storage condition being that residual data yet to be written in a currently written block that is currently being written is estimated to be writable into the first memory by the time when the output voltage becomes lower than the lower limit-corresponding voltage;

in response to determining that the storage condition is not satisfied, execute a first response process of withdrawing writing the residual data into the first memory but setting the validity flag corresponding to the currently written block as invalid; and in response to determining that the storage condition is satisfied, execute a second response process of writing the residual data yet to be written from the currently written block into the first memory, wherein the plurality of data storage control devices include a first device configured to execute a second predetermined process of transmitting a predetermined type of base data and a second device configured to use the base data received from the first device to execute a first predetermined process different from the writing process, the first response process, and the second response process, and the first threshold voltage in the second device is lower than the first threshold voltage in the first device.

11. The data storage control system according to claim 10, wherein, in each of the plurality of data storage control devices, the memory controller is configured to, in response to the condition determination unit determining that the voltage condition is satisfied during the execution of the writing process, specify an amount of residual data, and the storage condition includes a condition that the amount of residual data is equal to or less than a predetermined threshold data amount.

12. The data storage control system according to claim 10, the second device further comprises a first predetermined process control unit configured to control execution of the first predetermined process, the first predetermined process control unit being configured to, in response to the output voltage specified based on the voltage-related information becoming equal to or lower than a second threshold voltage that is a predetermined threshold voltage within the voltage range and higher than the lower limit-corresponding voltage, stop the first predetermined process under execution.

13. The data storage control system according to claim 10, wherein the power supply device includes a battery, the plurality of data storage control devices are mounted to a vehicle equipped with the power supply device, an engine, a power generator that generates electric power by being driven by the engine and charges the power into the battery, and an auto start-stop control device that executes auto start-stop control, and in each of the plurality of data storage control devices, the first threshold voltage is set to a higher voltage value under execution of the auto start-stop control than not under execution of the auto start-stop control.

* * * * *